United States Patent [19]

Davis

[11] Patent Number: 5,077,488

[45] Date of Patent: Dec. 31, 1991

[54] DIGITAL TIMING SIGNAL GENERATOR AND VOLTAGE REGULATION CIRCUIT

[75] Inventor: Charles L. Davis, Flower Mound, Tex.

[73] Assignee: Abbott Laboratories, Abbott Park, Ill.

[21] Appl. No.: 319,883

[22] Filed: Mar. 3, 1989

Related U.S. Application Data

[63] Continuation of Ser. No. 220,929, Jul. 15, 1988, abandoned, which is a continuation of Ser. No. 922,389, Oct. 23, 1986, abandoned.

[51] Int. Cl.[5] .......................... H03K 3/01; H03K 5/13

[52] U.S. Cl. ................................ 307/296.6; 307/603; 307/606; 307/296.1

[58] Field of Search .................. 307/296.1, 296.6, 443, 307/445, 480, 269, 590, 594, 595, 600, 602, 606, 605, 592

[56] References Cited

U.S. PATENT DOCUMENTS

| | | | |
|---|---|---|---|
| 2,984,789 | 5/1961 | O'Brien . | |
| 3,445,752 | 5/1969 | Horvot | 377/126 |
| 3,562,668 | 2/1971 | Bartlett et al. . | |
| 3,602,802 | 8/1971 | Chan et al. . | |
| 3,611,158 | 10/1971 | Strathman . | |
| 3,622,809 | 11/1971 | Williams | 307/606 |
| 3,659,277 | 4/1972 | Brown . | |
| 3,909,695 | 9/1975 | Peck . | |
| 4,091,335 | 5/1978 | Giolma et al. . | |
| 4,236,199 | 11/1980 | Stewart | 331/57 |
| 4,245,289 | 1/1981 | Mineck et al. . | |
| 4,356,412 | 10/1982 | Moench et al. . | |
| 4,358,728 | 11/1982 | Hashimoto . | |
| 4,438,346 | 3/1984 | Chuang et al. | 331/57 |
| 4,499,428 | 2/1985 | Bazes . | |
| 4,500,949 | 2/1985 | Prete . | |
| 4,536,720 | 8/1985 | Cranford, Jr. et al. | 307/297 |
| 4,581,546 | 4/1986 | Allan . | |
| 4,618,786 | 10/1986 | Johnson | 307/594 |
| 4,628,215 | 12/1986 | Lou | 307/297 |
| 4,638,184 | 1/1987 | Kimura | 307/296.8 |
| 4,656,369 | 4/1987 | Lou | 307/297 |
| 4,714,924 | 12/1987 | Ketzler | 307/602 |
| 4,843,258 | 7/1989 | Miyawaki et al. | 307/296.2 |

FOREIGN PATENT DOCUMENTS

| | | | |
|---|---|---|---|
| 0019426 | 1/1984 | Japan | 307/606 |

OTHER PUBLICATIONS

Berger et al., "Speed Control in Digital Circuits", IBM Disclosure, vol. 16, No. 7, Dec. 1973, pp. 2304–2305.

*Primary Examiner*—Timothy P. Callahan
*Attorney, Agent, or Firm*—Donald L. Corneglio; Donna Bobrowicz; Richard D. Schmidt

[57] ABSTRACT

A digital circuit both provides multiphasic timing signals and regulates the operating voltage of a non-ideal power source. In one embodiment, a delay line is provided whose delay characteristics vary inversely with operating voltage. Control gates are connected to selected outputs of the delay line to receive at differing times a control signal propagated through the delay line. In a preferred embodiment the control gates generate output signals the duration of which are determined by the delay characteristics of the delay line (and thus by the level of the operating voltage), such that the output signal duration increases in response to increases in operating voltage. The output signals activate current sinks or loads which increase the current drain on the non-ideal power source, thereby depressing its voltage. Regulation is optimized when the power source comprises a power supply having a significant output impedance at normal operating current levels, or the a power source is derived from a remote power supply coupled to said remote power supply by a high impedance or lossy coupling.

15 Claims, 4 Drawing Sheets

DIGITAL TIMING SIGNAL GENERATOR AND VOLTAGE REGULATION CIRCUIT

This application is a continuation of U.S. application Ser. No. 07/220,929, filed July 15, 1988, which was a continuation of U.S. application Ser. No. 06/922,389, filed Oct. 23, 1986.

BACKGROUND OF THE INVENTION

1. Field of the Invention

This invention relates generally to timing signal generator circuits, and also to voltage regulator circuits. The invention particularly relates to a circuit in which signals generated by a timing signal generator are used to automatically control the activation of current loads which are used to regulate the operating voltage of a non-ideal power source.

2. Statement of Related Art

Many digital logic circuits in use today require a source of multiphasic timing signals for their operation. It is known that ring oscillators and delay lines are inexpensive sources of such timing signals and accordingly these timing signal generators have found widespread use in both discrete and integrated logic circuits.

It is also known that the propagation rate of such timing circuits, when constructed of CMOS devices such as CMOS inverters, varies predictably with variations in the supply voltage. Accordingly, it has been recognized that the interval between timing pulses or the frequency of such pulses provides an indication of the supply voltage. See, for example, Hashimoto U.S. Pat. No. 4,358,728.

However, conventional voltage regulation circuitry adds expense and complexity to circuits. In addition, in the case of integrated circuits, it takes up precious substrate space that could otherwise be used to fabricate additional logic components.

Moreover, many miniature passive circuits in use today derive operating power from power/timing signals transmitted by remotely located control circuits. Such circuits are often found, for example, in miniature transponder systems, implantable medical devices, and portable data retrieval applications. See U.S. Pat. Nos. 3,859,624 to Kriofsky et al.; 4,408,608 to Daly et al.; 4,533,988 to Daly et al.; and 4,196,418 to Kip et al. Circuits of this type typically are designed to operate on low power and to take up minimum space. Accordingly, it is particularly desirable in these types of circuits to regulate the local operating voltage derived from the power/timing signals without the requirement of additional voltage regulation circuitry.

Accordingly, it is an object of the invention to provide a timing signal generator circuit that generates multiphasic timing signals while regulating the local operating voltage of the circuit.

It is another object to provide such a circuit that regulates the operating voltage without the need for conventional voltage regulation circuitry, or that can also be utilized in conjunction with such conventional circuitry to achieve additional voltage regulation.

It is still another object to provide such a circuit that is simple but flexible in design, construction, and operation, and that can be conveniently and inexpensively fabricated in integrated circuit form.

SUMMARY OF THE INVENTION

The foregoing objects and attendant advantages are achieved by providing a digital timing signal generator and voltage regulator circuit in which in broad form a timing signal generator generates timing signals having timing relationship related to the level of the operating voltage of a non-ideal local power source which supplies power to the timing generator, a regulator circuit, and other local logic circuits, where the regulator circuit is connected to the timing signal generator and responds to the timing relationship of the timing signals to selectively load the local power source in order to regulate its output voltage by adjusting the magnitude of the current drawn from the local power source in relationship to the magnitude of the operating voltage. Because of the non-ideal nature of the power source, which preferably includes a high impedance characteristic, increasing the total current sink attached to the local power source will decrease its output voltage, and vice versa. In this manner, the outputs of the timing signal generator, which may also typically be required for control and operation of the optional circuits such as logic circuits, also control a local voltage regulator to regulate the local power source voltage.

In one aspect, the timing generator propagates a signal at a rate related to the level of its supply voltage to generate at least one timing signal. When the timing relationship is less than a predetermined minimum value, gates are activated to selectively load the local power source in order to regulate its voltage level.

In another aspect, a delay line propagates signals to generate at least one timing signal. A plurality of gates having inputs connected to selected stages of the delay line receive selected timing signals. When the signals overlap, the gates are activated and load means connected thereto load the local power source to regulate its voltage level.

In still another aspect, a circuit continuously propagates a signal to generate at least one timing signal. The circuit is arranged and constructed to consume current in approximately a square relationship with increases in its supply voltage in order to regulate the voltage.

BRIEF DESCRIPTION OF THE DRAWING

The novel features that are believed to be characteristic of the invention are set forth in the appended claims. The invention itself will be best understood by reference to the following detailed description of several circuits which constitute preferred embodiments of the invention, in conjunction with the drawing, in which:

DETAILED DESCRIPTION OF THE PRESENTLY PREFERRED EMBODIMENTS

Figure 1:
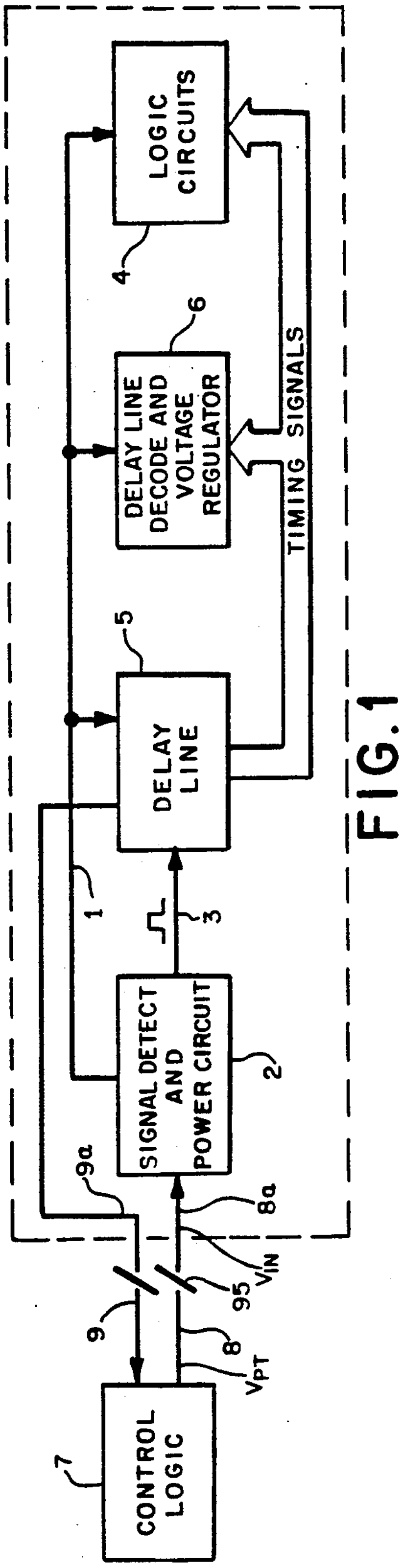
FIG. 1 is a block diagram illustrating the preferred mode of using the delay line timing signal generator and voltage regulator circuit embodying the invention.

With reference to the drawing, FIG. 1 generally illustrates the preferred form of the invention which broadly comprises a timing signal generator such as a delay line 5 and an associated delay line decode and voltage regulator 6 which receives and is responsive to the generated timing signals. In the presently preferred form of the invention, the delay line 5 and voltage regulator 6 are fabricated along with a signal detect and power circuit 2 and various logic circuits 4 in an integrated circuit chip (IC). The IC is suitably fabricated using conventional CMOS fabrication processes known to those skilled in the art.

In one preferred form, the IC receives its operating power from an external control logic circuit 7 which is powered by its own power supply. In this form, the control logic circuit 7 includes conventional circuitry for generating and transmitting a power/timing signal $V_{PT}$, on an output 8. The power/timing signal $V_{PT}$ may comprise a carrier signal modulated with digital pulses having predetermined nominal frequency, amplitude, and duty cycle. Such control logic circuitry is conventional and does not comprise part of the present invention. See, for example, the circuits described in the various U.S. Patents cited above.

The output 8 of the control logic circuit 7 and the signal input terminal 8*a* of the IC are preferably isolated by inductive coupling, although capacitive, resistive, or optical coupling may also be employed. For example, the control logic 7 may be inductively coupled 95 by means of a transformer or, in the case of a remote IC forming part of an implantable prosthetic device, by transcutaneous transmitting and receiving coils. As a result of this coupling 95, power is received by the IC chip as a signal $V_{IN}$, which is input 8*a* to the signal detect and power circuit and comprises the source of power for the IC and its associated circuits. However, whatever coupling arrangement is used should preferably have a relatively high resistance component compared to the input resistance of the IC. Thus, in the case of inductive coupling, for example, a low efficiency coupling is preferred.

The signal input 8*a* ($V_{IN}$) is connected to an input of the signal detect and power circuit 2. The signal detect and power circuit 2 detects the digital pulses on the modulated carrier and serially outputs corresponding digital pulses on line 3. At the same time, it also derives from the modulated carrier an operating voltage $V_{REG}$ which is in turn used to power the delay line 5, the voltage regulator 6, and the various logic circuits 4. The signal detect and power circuit 2 is a conventional circuit and is familiar to those skilled in the art. One form of the circuit that is particularly preferred for use with the present invention is described and illustrated in the applicant's co-pending U.S. application Ser. No 818,469 filed Jan. 13, 1986.

The delay line 5 receives the digital pulses on line 3 and generates multiphasic timing signals therefrom. The timing signals are received and used by the various logic circuits 4 to carry out their respective logic functions. The timing signals are also received by the voltage regulator 6 which decodes them and, if necessary, selectively applies predetermined current loads to the operating voltage $V_{REG}$ in a manner described more fully below, in order to regulate and reduce the local $V_{REG}$ to a predetermined nominal value. The delay line may also output one of the digital timing signals on an output terminal 8*b* to an input 9 of the control logic 7. The output 8*b* and input 9 are preferably isolated or coupled as described above. Preferably, the digital timing signal on lines 9 and 8*b* can share the isolation or coupling means with the power/timing signal on lines 8 and 8*a*. The control logic 7 may determine the delay between output pulses on line 8 and timing pulses on the input 9 as an indication of the local operating voltage $V_{REG}$ and use this data to provide additional regulation by altering the width of the encoded digital pulses or the amplitude of the power/ timing signal $V_{PT}$ on output 8. The control logic 7 may also use the signals on line 9 to regulate the frequency of the encoded digital pulses on output 8.

Figure 2:
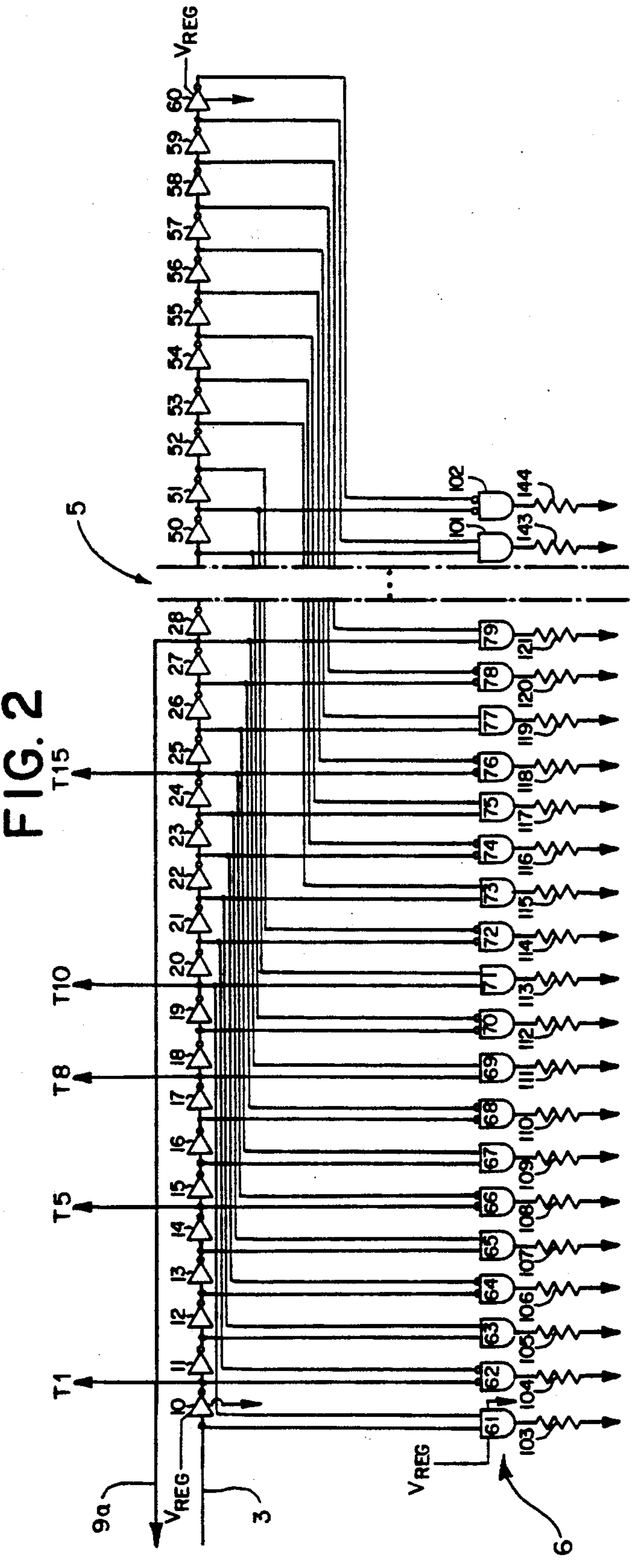
FIG. 2 is a schematic diagram illustrating the details of a delay line timing signal generator and first order voltage regulator circuit comprising one preferred embodiment of the invention.

FIG. 2 schematically illustrates a delay line timing signal generator and first order voltage regulator circuit comprising one preferred embodiment of the invention. The delay line 5 preferably comprises series-connected CMOS inverters 10–60 not all of which are shown due to space limitations. The delay line 5 produces multiphasic timing signals. Representative of these signals are signals T1, T5, T8, T10, and T15, each having different phase, at the outputs of inverters 10, 14, 17, 19, and 24 respectively. These signals, or other such signals, are typically used by the general logic circuits 4 to provide needed clocking and control signals in a manner well known in the art.

Gates 61–102 inclusive and resistors 103–144 inclusive comprise a first order voltage regulator 6. Each control gate 61–102 has a corresponding resistor 103–144 respectively connected between its output terminal and ground. The resistors form current sinks or loads that draw current from the local power source $V_{REG}$ when the output of the associated control gate is in its high state. The inputs of the gates 61–102 are preferably connected to the delay line 5 in such a way that they are distributed along its length and are activated sequentially. The inputs are also preferably connected to the delay line 5 in such a way that the input signals to each gate have the same relative delay between them so that all of the gates are activated and deactivated at the same supply or operating voltage level, as described below.

Accordingly, one input of the control AND gate 61 is connected to the input 3 of the delay line 5 at the input of the inverter 10. The other input of the AND gate 61 is connected to the output of the inverter 19. The inputs of the control NOR gate 62 are connected to the outputs of the inverters 10 and 20 respectively. The inputs of the AND gate 63 are connected to the outputs of the inverters 11 and 21 respectively. The inputs of the NOR gate 64 are connected to the outputs of the inverters 12 and 22, and so on with the inputs of the last AND gate 101 being connected to the outputs of the inverters 49 and 59, and the inputs of the last NOR gate 102 being connected to the outputs of the inverters 50 and 60.

From the foregoing it is apparent that there is a relative delay of ten (10) inverter gate delays between the input signals to each gate. It is also apparent that the inputs of the gates 61–102 are distributed along the length of the delay line 5 so that each input signal to each gate except gate 10 is delayed by one inverter gate delay with respect to the corresponding input signal to the preceding gate. In the presently preferred embodiment, control gates connected to the outputs of odd stages of the delay line 5, i.e. gates 62, 64, 66, 68, and so on through gate 102 are NOR gates whereas control gates connected to outputs of even stages of the delay line 5, i.e. gates 61, 63, 65, 67, and so on through gate 101 are AND gates.

It is preferable that only one digital pulse propagate through the delay line 5 at any given time. On the other hand, it is also preferable that there be a minimum of delay between successive pulses propagating through the delay line 5 so that the amount of time the operating voltage is unregulated is minimized. These operating characteristics are obtained by selecting a delay line 5 having an appropriate length, i.e. having an appropriate number of stages, based on the desired nominal operating voltage, the desired nominal frequency, and the per-gate propagation delay of the particular devices selected for use, which as those skilled in the art are aware is readily available from the various manufacturer's data sheets. Typical operating parameters which will be assumed in the following description are as follows: a nominal pulse frequency of 100 kHz; and a nominal circuit operating voltage of 2.5 V. At the selected nominal operating voltage, a typical propagation delay of a typical CMOS inverter is approximately 100 nS. Accordingly, given the nominal pulse frequency of 100 kHz, in order to ensure that only one pulse is propagating through the delay line 5 at any time, the delay line 5 must have at least 51 inverters as illustrated in the figures.

The preferred duration of the pulses 3 input to the delay line, and thus the nominal duty cycle of the input signal 3, is determined by the relative delay time between input signals to each of the gates 61–102. Thus, with respect to the nominal values above, a pergate propagation delay of approximately 100 nS and a ten (10) inverter delay between input signals as shown in FIG. 1 corresponds to a digital pulse having a nominal on-time of 1 μS. When the amplitude of $V_{REG}$ is below its nominal value, moderate changes in the width of the pulses have no effect on it. When $V_{REG}$ is at or near its nominal level, i.e. the level at which the gates 61–102 are on the edge of being activated, increases in the on-time of the pulses reduces $V_{REG}$ while decreases have no effect. When $V_{REG}$ exceeds its nominal value and is within the range requiring regulation, increases in the width of the pulses reduce $V_{REG}$ while decreases in width increase $V_{REG}$, both approximately linearly.

If it is desired to extend or shorten the nominal on-time of the pulses, the number of gates of delay between input signals to the gates 61–102 should be correspondingly increased or decreased as appropriate for optimum performance as described above. Another consideration in selecting the appropriate pulse duration and nominal duty cycle is that the duty cycle affects the energy per cycle delivered to the circuit. Also, a longer digital pulse on time results in more control and better control resolution over the operating voltage.

The load resistors 103–144 are selected based upon the particular application of the circuit embodying the invention. In order for the circuit to provide sufficient regulation of the operating voltage, the resistors should be selected so that when the gates 61–102 are activated, the voltage regulator circuit becomes the major current drawing portion of the passive circuitry with which it is associated. However, the delay line decode and voltage regulator circuit 6 obviously should not draw so much current that it lowers $V_{REG}$ to a level that renders the associated logic circuitry 4 inoperative. Within these parameters, the specific values of the resistors 103–144 are selected based on the input impedance of the associated circuitry, the number of resistors to be used, and the amount of current loading required to achieve the desired voltage regulation. For example, resistors having values ranging from 500–2000 ohms have been found suitable.

In operation, each digital pulse 3 transmitted by the logic control circuit 7 and extracted by the signal detect circuit is input to the inverter 10 of the delay line 5. The pulse is inverted and delayed by each inverter as it propagates down the delay line 5. The output pulses of stages 10–51 are input to first terminals of corresponding gates 61–102 respectively. Even stages output positive pulses while odd stages output inverted pulses. The output pulses of stages 19–60 are input to second terminals of the gates 61–102 respectively. Accordingly, the logic high pulse input to the inverter 10 is also input to one terminal of the AND gate 61. The same uninverted signal delayed by ten inverters appears at the output of inverter 19 and is connected to the other input terminal of AND gate 61. Likewise, the inverted pulse at the output of inverter 10 is input to one terminal of NOR gate 62. The same inverted pulse delayed by ten inverters is output by inverter 20 to the other terminal of the NOR gate 62. The same applies to the inputs of the remaining gates 63–102.

As long as the control logic circuit 7 continues to transmit $V_{PT}$ with the encoded digital pulses at the nominal frequency and duty cycle, and with the appropriate amplitude to keep the coupled or received signal $V_{IN}$ at appropriate conditions to maintain the operating voltage $V_{REG}$ of the delay line 5 at the nominal value, there is no overlap between the delayed and undelayed pulses at the input terminals of the gates 61–102. In other words, with respect to the even stages, by the time the delayed logic high pulse reaches the second input terminal of the corresponding AND gate, the undelayed pulse on the first input terminal has changed state and the AND gate is not activated. The same result occurs with respect to the inverted pulses generated by the odd stages and the corresponding NOR gates. As a result, no current is drawn through the resistors 103–144 to ground.

As the amplitude of the received signal $V_{IN}$ increases, such as due to increases in the power/timing signal $V_{PT}$ transmitted by the control logic circuit 7 or due to changes in the coupling efficiency, the local operating voltage $V_{REG}$ increases whether for these or other reasons, and the propagation delay of the delay line inverters 10–60 decreases correspondingly. As the operating voltage $V_{REG}$ increases, whether for these or other reasons, the propagation delay decreases until a point is reached at which the delayed pulses reach the second input terminals of the corresponding gates 61–102 before the undelayed pulses on the first input terminals have changed state. In other words, the pulses overlap at the inputs to the gates. When this occurs, the outputs of the gates 61–102 go high and current is drawn through the corresponding resistors 103–144 to ground, thus loading the power source or bus that supplies the IC. Preferably, when the gates 61–102 are activated, the voltage regulator circuit 6 draws most of the current received by the remote circuit. In this way, the circuit embodying the invention inherently regulates and reduces the level of the operating voltage $V_{REG}$. If, in turn, the control load current is also a significant portion of the current supply capability of a non-ideal power supply that is part of control circuit 7, regulator 6 may optionally act to regulate the output $V_{PT}$ and the control circuit power supply as well, although this is not required for the desired local regulation of $V_{REG}$ discussed above because of the impedance of coupling 95.

As the amplitude of $V_{REG}$ continues to increase, the amount of overlap between the undelayed and delayed pulses increases correspondingly. As a result, the regulator circuit 6 loads the power supply over an increasing percentage of each pulse. In addition, as the delayed and undelayed input pulses increasingly overlap, successive gates become activated simultaneously. Since the load resistances connected to the outputs of these gates are in parallel, the total resistance presented to the operating voltage is reduced and the voltage is loaded even further. The preferred embodiment thus provides progressive voltage regulation as a function of the level of the operating voltage.

When the amplitude of $V_{REG}$ stops increasing, the degree of overlap and the percentage of each pulse that is loaded also stops increasing. During this equilibrium condition, the voltage $V_{REG}$ will be slightly above its nominal value. As the amplitude of $V_{REG}$ decreases, such as when $V_{IN}$ decreases, the degree of overlap and the percentage of each pulse that is loaded decreases accordingly until at some point at or near the desired nominal value of $V_{REG}$ there is no longer any overlap between the undelayed and delayed pulses.

As previously noted, the pulse propagating through the delay line 5 may also be fed back from the output of an inverter, such as inverter 27, to the input 9 of the control logic circuit 7. The control logic circuit 7 can determine the value of the delay line delay by detecting the interval between output and input pulses on lines 8 and 9, respectively, using a conventional edge-activated counter, for example. Since this interval is a function of the operating voltage $V_{REG}$, the control logic circuit 7 can use the delay information to provide additional voltage regulation if needed or desired, for example, by varying the width of the encoded pulses or the amplitude of the transmitted signal or both. Such changes will affect the output $V_{PT}$ and the received $V_{IN}$, and thus adjust $V_{REG}$.

Since the signals on the first and second input terminals of all of the gates 61-102 have the same number of gates of delay between them, all of the gates 61-102 are activated at the same supply voltage level. However, since the inputs of the gates 61-102 are distributed along the length of the delay line 5, the gates are activated sequentially rather than simultaneously. As a result, the preferred circuit embodying the invention does not draw a large amount of current instantaneously when the gates 61-102 are activated but rather continuously loads the power supply. Such an arrangement is preferred to minimize the possibility of large, sudden rises or drops in voltage.

Figure 3:
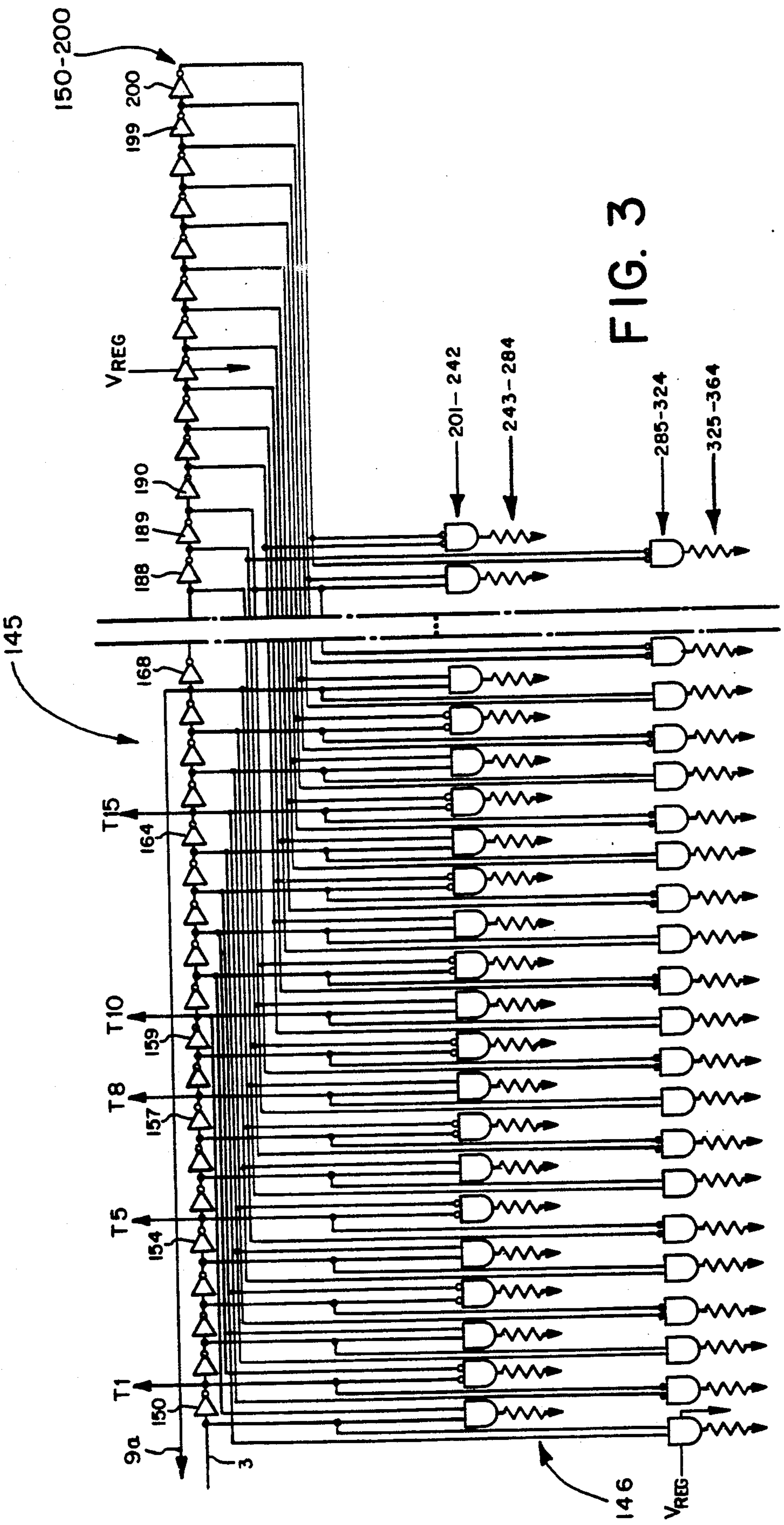
FIG. 3 is a schematic diagram illustrating the details of a delay line timing signal generator and second order voltage regulator circuit comprising another preferred embodiment of the invention.

FIG. 3 illustrates a delay line timing signal generator and second order voltage regulator circuit which comprises another preferred embodiment of the invention. The delay line 145 is comprised of series connected inverters 150-200 numbered consecutively from left to right in the figure. Representative timing signals T1, T5, T8, T10, and T15 are provided at the outputs of inverters 150, 154, 157, 159, and 164 respectively as in the delay line 5 of FIG. 1. The second order voltage regulator 146 includes a first level of gates 201-242 and associated load resistors 243-284 which are numbered consecutively from left to right in the figure. Due to space limitations, not all of the inverters and first level gates and load resistors are illustrated. The gates 201-242, inverters 150-200, and load resistors 243-284 correspond identically to the gates 61-102, inverters 10-60, and load resistors 103-144 respectively of FIG. 1 and are interconnected in exactly the same manner as described above with respect to FIG. 1.

In addition, the second order voltage regulator 146 includes a second level of gates 285-324 and corresponding load resistors 325-364, which are numbered consecutively from left to right in the figure. Not all of the second level gates and load resistors are illustrated due to space limitations. The resistors 325-364 are connected between the outputs of the gates 285-324 respectively and ground. Similarly to the first order regulator of FIG. 2, the gates 285, 287, 289 and so on through 323 have inputs connected to outputs of even stages of the delay line 145 and are AND gates. The gates 286, 288 and so on through 324 have inputs connected to outputs of odd stages of the delay line and are NOR gates.

In contrast to the ten-gate delay between the input signals to each of the gates 201-242 in the first level, the input terminals of the gates 285-324 in the second level are connected to the inverters 150-200 so that there is a twelve-gate delay between the input signals. Thus, for example, the input terminals of the first gate 285 are connected to the input of the inverter 150 and to the output of the inverter 161. The input terminals of the second gate 286 are connected to the outputs of the inverters 150 and 162. The inputs of the gate 287 are connected to the outputs of the inverters 151 and 163, and so on with the inputs of the last gate 324 being connected to the outputs of the inverters 188 and 200.

In the circuit of FIG. 3, the first level gates 201-242 are activated to load the power supply of the logic control circuit 7 at a first voltage level exceeding the nominal value of the operating voltage $V_{REG}$ as described above with respect to the circuit of FIG. 1. The second level gates 285-324 are activated at a second higher voltage level to provide additional, progressive loading of the power supply and further inhibit any increase in the operating voltage $V_{REG}$ The voltage levels that trigger activation of the first and second level gates 201-242 and 285-324 respectively depend on the nominal operating voltage value selected, the propagation delay of the inverters, and the number of gates of delay selected between the gate input signals. The greater the selected delay, the greater the voltage level required for activation. In the embodiment of FIG. 3, for example, there is only a twogate delay difference between the gate input signals at the first and second levels. Accordingly, the second level gates 285-324 are progressively activated at an input voltage level only slightly greater than that required to activate the first level gates 201-242.

Figure 4:
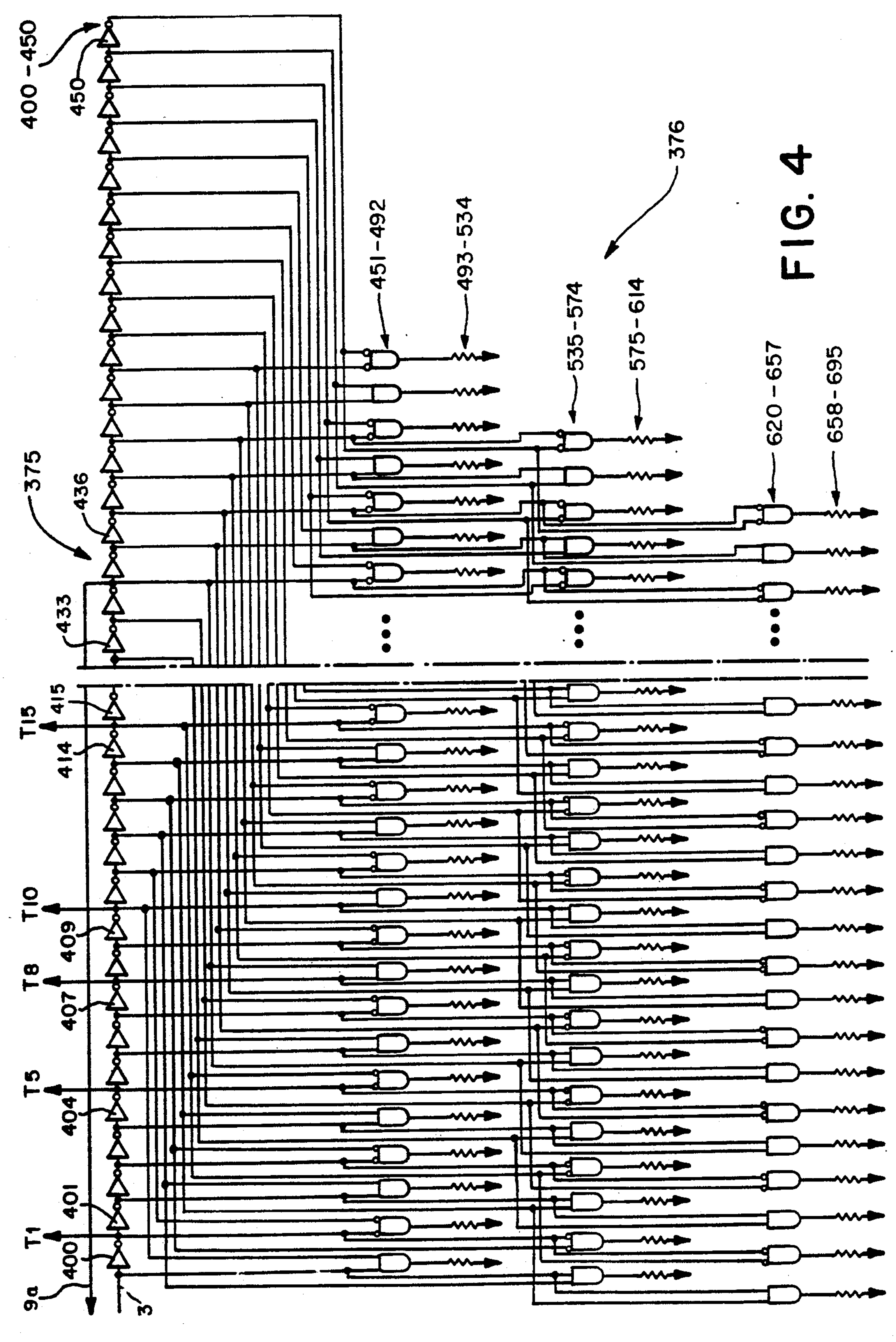
FIG. 4 is a schematic diagram illustrating the details of a delay line timing signal generator and third order voltage regulator circuit comprising yet another preferred embodiment of the invention.

FIG. 4 illustrates a delay line timing signal generator and third order voltage regulator circuit which comprises yet another preferred embodiment of the invention. The delay line 375 comprises series-connected inverters 400-450 which are numbered consecutively from left to right in the figure. Representative timing signals T1, T5, T8, T10, and T15 are provided at the outputs of inverters 400, 404, 407, 409, and 414. The third order voltage regulator 376 contains three levels of gates and associated load resistors, which are numbered consecutively in each level from left to right in the figure. Not all of the gates, resistors, and inverters are illustrated due to space limitations.

The first level comprises gates 451–492 and associated load resistors 493–534 which are connected between the outputs of gates 451–492 respectively and ground. The second level comprises gates 535–574 and load resistors 575–614 which are connected between the outputs of the gates 535–574 respectively and ground. The third level comprises gates 620–657 and load resistors 658–695 which are connected between the outputs of the gates 620–657 respectively and ground.

The first level gates 451–492 and load resistors 493–534 correspond identically to the first level gates 201–242 and load resistors 243–284 of the circuit of FIG. 3, and the first level gates 61–102 and load resistors 103–144 of the circuit of FIG. 1. The second level gates 535–574 and load resistors 575–614 correspond identically to the second level gates 285–324 and load resistors 325–364 of the circuit of FIG. 3. The first and second level gates 451–492 and 535–574 respectively and load resistors 493–534 and 575–614 respectively are interconnected with the delay line 375 in exactly the same manner as their counterpart devices described above with respect to FIGS. 1 and 3.

The third level gates 620–657 are interconnected with the inverters 400–450 of the delay line 375 so that there is a fourteen-gate delay between the digital pulse signals at the first and second input terminals of each gate 620–657. Thus, for example, the input terminals of the first gate 620 are connected to the input of the inverter 400 and to the output of the inverter 413. The input terminals of the second gate 621 are connected to the outputs of the inverters 400 and 414. The inputs of the third gate 622 are connected to the outputs of the inverters 401 and 415, and so on with the inputs of the last gate 657 being connected to the outputs of the inverters 436 and 450. The gates 620, 622, 624 and so on through gate 656 have inputs connected to outputs of even stages of the delay line 375 and are AND gates. The gates 621, 623 and so on through gate 657 have inputs connected to outputs of odd stages of the delay line 375 and are NOR gates.

In the circuit of FIG. 4, the first level gates 451–492 are activated to load the power supply at a first voltage level exceeding the nominal operating voltage value. The second level gates 535–574 are activated to further load the power supply at a second slightly greater voltage level. Because the delay between the input pulses to the third level gates 620–657 is two gate delays greater than the delay between the input pulses to the second level gates 535–574, the third level gates 620–657 are activated at a third voltage level which is slightly greater than the level necessary to activate the second level gates 535–574. Thus, the three level regulation provides even more progressive voltage regulation than the first and second level embodiments.

The preferred second and third order regulator embodiments are made even more progressive by reducing the values of the load resistors in each level. Thus, the third level load resistors preferably have lower values than the second level load resistors which have lower values than the first level load resistors. With this arrangement, the second and third level load resistors load the supply voltage more heavily than the first level load resistors. As a result, progressive regulation is obtained even if the second and third level gates are activated only very briefly.

Figure 5:
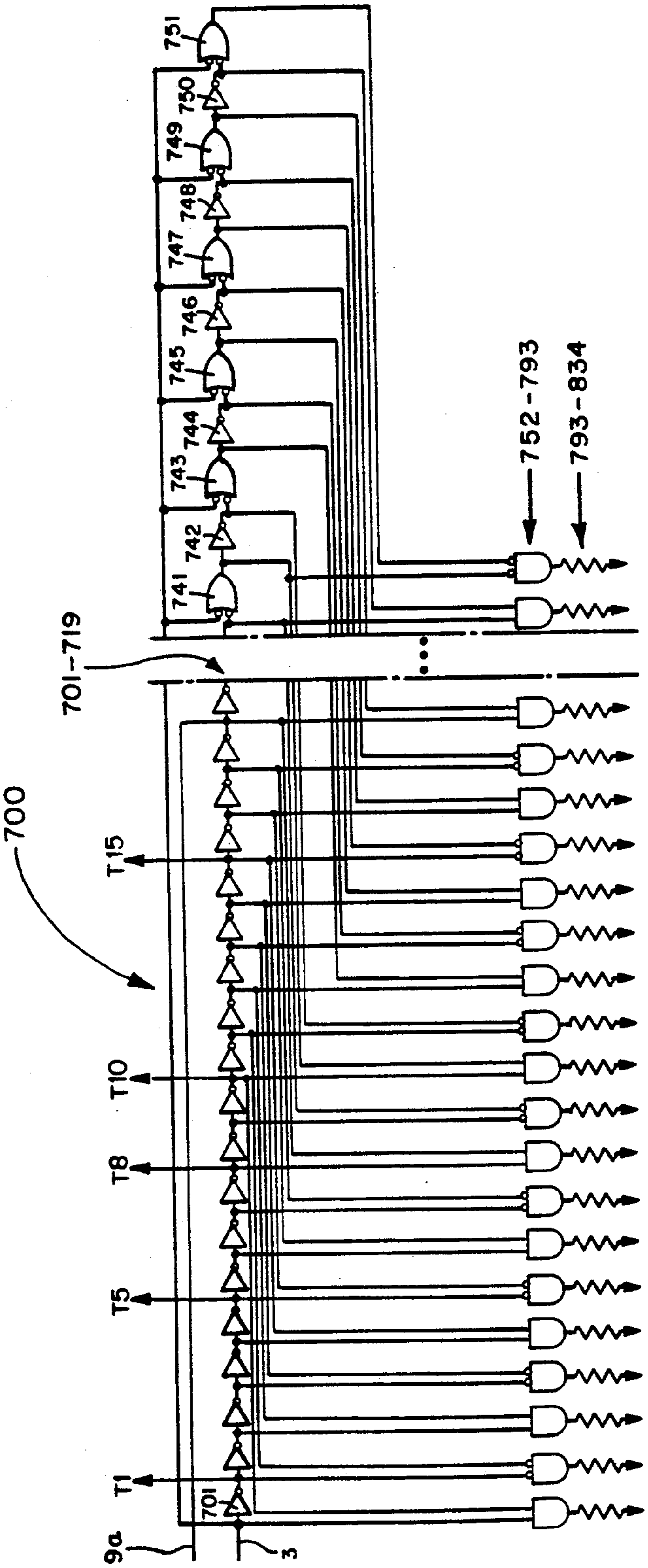
FIG. 5 is a schematic diagram illustrating the details of a delay line timing signal generator and first order voltage regulator circuit according to the invention which has been modified to extinguish signals propagating in the "tail" of the delay line when a pulse is received at the "head" of the delay line.

A preferred variation on the basic form of the circuit embodying the invention is illustrated in FIG. 5. As shown, gates 752–793 and corresponding load resistors 793–834 both numbered consecutively from left to right in the figure, comprise a first order voltage 700 and which operates in the same manner described above with respect to FIG. 1. However, in the preferred variation a number of the series-connected inverters making up the delay line 700 are replaced by NAND gates. Specifically, referring to FIG. 1, inverters 50, 52, 54, 56, 58, and 60 are replaced with NAND gates 741, 743, 745, 747, 749, and 751 respectively. Thus, the last eleven stages of the delay line 700 are alternately NAND gates and inverters. One input of each NAND gate 741, 743, 745, 747, 749, and 751 is connected to the output of the preceding inverter 740, 742, 744, 746, 748, and 750 respectively. The other input of each NAND gate 741, 743, 745, 747, 749, and 751 is connected to the input 3 of the delay line 700.

In this embodiment, if a power pulse should be input to the head of the delay line 700 before the preceding power pulse has completely propagated through the tail of the delay line 700, the preceding power pulse will be extinguished by maintaining the NAND gate outputs low so that it cannot activate any of the last eleven gates 782–793. This modification compensates for variations in the frequency of the power pulses transmitted by the control logic circuit 7 and allows the circuit embodying the invention to be used over a wider range of operating conditions.

Figure 6:
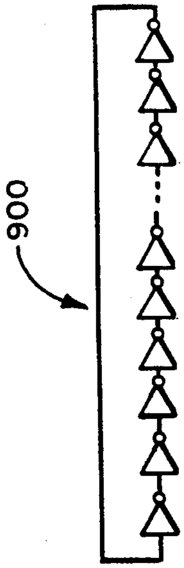
FIG. 6 is a schematic diagram of a ring oscillator comprising an alternative embodiment of the invention.

Another variation of the invention is to utilize a CMOS ring oscillator as illustrated in FIG. 6 in place of the previously described timing signal generator and voltage regulator circuits described above. It has been found that a ring oscillator 900 comprised of multiple CMOS inverters will consume current in approximately a square law relation with variations in operating voltage, at least over the typical operating range of the CMOS devices. In other words, if the operating voltage doubles, the current consumed by the ring oscillator 900 approximately quadruples. Because of the non-ideal nature of the local power source, such as due to high impedance or lossy coupling, the significant increase in current draw resulting from the increase in resonating frequency of the ring oscillator will load $V_{REG}$ and reduce the local voltage.

However, it is to be understood that a ring oscillator 900 having the same number of stages as any of the preferred circuits previously described, will not consume nearly as much current over its normal operating range as will the control gates and load resistors of the previously described circuits. Accordingly, the ring oscillator embodiment may only be useful as a regulator in circuits rated for much lower current consumption. In larger circuits, for the ring oscillator to draw sufficient current to have a suitable regulation effect, it would have to have a much larger number of stages than the embodiments described above. Accordingly, the ring oscillator embodiment constitutes a less preferred alternative for such applications.

What have been described are certain aspects of various digital timing signal generator and voltage regulator circuits which constitute presently preferred embodiments of the invention. It is understood that the foregoing description and accompanying illustration are merely exemplary and are in no way intended to limit the scope of the invention, which is defined by the appended claims. Various changes and modifications to the preferred embodiments will be apparent to those skilled in the art. Such changes and modifications may include but are not limited to changes in the length or number of stages of the delay lines, changes in the number and types of gates comprising the delay lines and voltage regulators, changes in the nominal values of various parameters and circuit elements, changes in the interconnections of the basic elements, and the like. Such changes and modifications can be made without departing from the spirit and scope of the invention. Accordingly, it is intended that all such changes and modifications and all other equivalents be covered by the appended claims.

I claim:

1. A digital timing signal generator and voltage regulator circuit for regulating an output voltage, comprising:

means for generating timing signals having a timing relationship related to the level of an operating voltage of a non-ideal power source associated with said means for generating; and means connected to said generating means and responsive to said timing relationship for current loading said non-ideal power source when said output voltage exceeds a desired level to regulate said output voltage.

2. The circuit defined in claim 1 wherein said means for generating timing signals comprises:

means for propagating a signal to generate timing signals, said means having a rate of propagation related to the level of said operating voltage.

3. The circuit defined in claim 2 wherein said means for propagating comprises a delay line.

4. The circuit defined in claim 1 wherein said means for current loading comprises:

gate means connected to said means for generating timing signals for receiving said timing signals, said gate means being activated when the period of said timing signals drops below a predetermined period; and load means connected to said gate means for loading said power source when said gate means are activated.

5. The circuit defined in claim 4 wherein said gate means and load means are arranged to progressively load said non-ideal power source when said output voltage exceeds a predetermined value.

6. The circuit defined in claim 2 wherein said means for generating timing signals generates a first timing signal and wherein said means for propagating generates a delayed timing signal which is offset from said first timing signal by a timing interval determined by said propagation rate of said means for propagating, and wherein said means for loading comprises:

gate means connected to said means for propagating for receiving said first timing signal and said delayed timing signal;

said gate means being activated when the timing interval between said first timing signal and said delayed timing signal is less than a predetermined value; and load means connected to said gate means for current loading said power source when said gate means are activated.

7. The circuit defined in claim 6 wherein said gate means and load means are arranged to progressively load said operating voltage when said power source exceeds a predetermined value.

8. A digital timing signal generator and voltage regulator circuit, comprising:

a delay line having a plurality of stages for generating timing signals with timing relationship related to the level of a supply voltage supplied by a non-ideal power source;

a plurality of gates having inputs connected to selected stages of said delay line for receiving selected timing signals, said gates being activated when said selected signals overlay; and a corresponding plurality of load resistors connected to the outputs of said plurality of gates for current loading said power source when said gates are activated in order to regulate said supply voltage.

9. In a system comprising a remote power supply and transmitter for transmitting digitally encoded power/timing signals, and local circuits including means for receiving said encoded signals and a local non-ideal power source which derives a local operating voltage from said power/timing signals, said local circuits also having logic means for performing selecting functions, the improvement comprising:

a delay line having a plurality of stages for receiving and propagating a first signal derived from said encoded digital signals to generate further timing signals for use by said circuit, said further timing signals having timing relationship related to the level of said local operating voltage;

a plurality of gates having inputs connected to selected stages of said delay line for receiving selected timing signals, said gates being activated when said selected timing signals overlap; and a corresponding plurality of load means connected to the outputs of said gates for current loading said local non-ideal power source when said gates are activated in order to regulate said local operating voltage.

10. The system defined in claim 9 wherein said plurality of gates have their inputs connected to selected stages distributed along said delay line so that the gates are activated sequentially.

11. A digital timing signal generator and voltage regulator circuit, comprising:

means for generating timing signals having a timing relationship related to the level of an operating voltage of a non-ideal power source associated with said means for generating; and means connected to said generating means and responsive to said timing relationship for current loading said non-ideal power source to regulate said operating voltage;

said means for current loading comprising gate means connected to said means for generating timing signals for receiving said timing signals, said gate means being activated when the period of said timing signals drops below a predetermined minimum period, said gate means comprising a plurality of levels of gates having inputs connected to said means for generating timing signals so that each level of gates is activated at a different predetermined value, said means for current loading further comprising load means connected to said gate means for loading said power source when said gate means are activated, said load means comprising a plurality of levels of load means corresponding to said plurality of levels of gates.

12. A digital timing signal generator and voltage regulator circuit, comprising:

a delay line having a plurality of stages for generating timing signals with timing relationship related to the level of a supply voltage supplied by a non-ideal power source;

a plurality of gates having inputs connected to selected stages of said delay line for receiving selected timing signals, said gates being activated when said selected signals overlap; and a corresponding plurality of load resistors connected to the outputs of said plurality of gates for current loading said power source when said gates are activated in order to regulate the said supply voltage;

said plurality of gates comprising a plurality of levels of said gates, and said plurality of load resistors comprising a plurality of levels of said load resistors corresponding to said levels of said gates, wherein the inputs of each level of gates are connected to selected stages of said delay line so that each level of gates is activated at a different predetermined value of said supply voltage.

13. A digital timing signal generator and voltage regulator circuit, comprising:

a delay line having a plurality of stages of generating timing signals with timing relationship related to the level of a supply voltage supplied by a non-ideal power source;

means for preventing the propagation of more than one signal through said delay line at any time;

a plurality of gates having inputs connected to selected stages of said delay line for receiving selected timing signals, said gates being activated when said selected signals overlap; and a corresponding plurality of load resistors connected to the outputs of said plurality of gates for current loading said power source when said gates are activated in order to regulate said supply voltage.

14. In a system comprising a remote power supply and transmitter for transmitting digitally encoded power/timing signals, and local circuits including means for receiving said encoded signals and a local non-ideal power source which derives a local operating voltage from said power/ timing signals, said local circuits also having logic means for performing selected functions, the improvement comprising:

a delay line having a plurality of stages for receiving and propagating a first signal derived from said encoded digital signals to generate further timing signals for use by said circuit, said further timing signals having timing relationship related to the level of said local operating voltage;

means for preventing the propagation of more than one digital signal through said delay line at any time;

a plurality of gates having inputs connected to selected stages of said delay line for receiving selected timing signals, said gates being activated when said selected timing signals overlap; and a corresponding plurality of load means connected to the outputs of said gates for current loading said local non-ideal power source when said gates are activated in order to regulate said local operating voltage.

15. In a system comprising a remote power supply and transmitter for transmitting digitally encoded power/timing signals, and local circuits including means for receiving said encoded signals and a local non-ideal power source which derives a local operating voltage from said power/timing signals, said local circuits also having logic means for performing selected functions, the improvement comprising:

a delay line having a plurality of stages for receiving and propagating a first signal derived from said encoded digital signals to generate further timing signals for use by said circuit, said further timing signals having timing relationship related to the level of said local operating voltage;

a plurality of gates having inputs connected to selected stages of said delay line for receiving selected timing signals, said gates being activated when said selected timing signals overlap; and a corresponding plurality of load means connected to the output of said gates for current loading said power source when said gates are activated in order to regulate said local operating voltage;

wherein said plurality of gates are arranged in a plurality of levels, and said plurality of load means are arranged in a plurality of levels corresponding to said plurality of levels of said gates, the inputs of each level of gates being connected to selected stages of said delay line so that each level of gates is activated at a different predetermined level of said local operating voltage.

* * * * *

UNITED STATES PATENT AND TRADEMARK OFFICE
CERTIFICATE OF CORRECTION

PATENT NO. : 5,077,488

DATED : March 3, 1989

INVENTOR(S) : C. Davis

It is certified that error appears in the above-identified patent and that said Letters Patent is hereby corrected as shown below:

Column 12, line 1, delete "operating voltage" and insert --power source--. after "load said".

Column 12, line 1, delete "power source" and insert --operating voltage-- after "when said".

Column 12, line 23, delete "selecting" and insert --selected-- after "for performing".

Signed and Sealed this

Twenty-first Day of September, 1993

Attest:

BRUCE LEHMAN

*Attesting Officer* *Commissioner of Patents and Trademarks*